United States Patent
Apiratikul et al.

(10) Patent No.: US 11,194,092 B2
(45) Date of Patent: Dec. 7, 2021

(54) ETCHED FACET IN A MULTI QUANTUM WELL STRUCTURE

(71) Applicant: Skorpios Technologies, Inc., Albuquerque, NM (US)

(72) Inventors: Paveen Apiratikul, Albuquerque, NM (US); Damien Lambert, Los Altos, CA (US)

(73) Assignee: SKORPIOS TECHNOLOGIES, INC., Albuquerque, NM (US)

(*) Notice: Subject to any disclaimer, the term of this patent is extended or adjusted under 35 U.S.C. 154(b) by 0 days.

(21) Appl. No.: 16/690,483

(22) Filed: Nov. 21, 2019

(65) Prior Publication Data
US 2020/0233150 A1    Jul. 23, 2020

Related U.S. Application Data

(60) Provisional application No. 62/770,532, filed on Nov. 21, 2018.

(51) Int. Cl.
 *G02B 6/12*  (2006.01)
 *G02B 6/136*  (2006.01)

(52) U.S. Cl.
 CPC ......... *G02B 6/12004* (2013.01); *G02B 6/136* (2013.01); *G02B 2006/12061* (2013.01); *G02B 2006/12121* (2013.01); *G02B 2006/12128* (2013.01)

(58) Field of Classification Search
 CPC .. G02B 6/12004; G02B 6/136; G02B 6/4228; G02B 2006/12061; G02B 2006/12128
 See application file for complete search history.

(56) References Cited

U.S. PATENT DOCUMENTS

| | | | |
|---|---|---|---|
| 6,214,178 B1* | 4/2001 | Chakrabarti | H01S 5/028 204/192.34 |
| 6,556,735 B1* | 4/2003 | Kato | G02B 6/122 385/14 |
| 8,149,891 B2* | 4/2012 | Funabashi | H01S 5/10 372/50.12 |
| 9,097,846 B2 | 8/2015 | Mizrahi et al. | |

(Continued)

FOREIGN PATENT DOCUMENTS

KR    20180115289 A    10/2018

OTHER PUBLICATIONS

PCT/US2019/062642 received an International Search Report and Written Opinion dated Mar. 17, 2020, 15 pages.

*Primary Examiner* — Daniel Petkovsek
(74) *Attorney, Agent, or Firm* — Kilpatrick Townsend & Stockton LLP

(57) ABSTRACT

An exemplary multi quantum well structure may include a silicon platform having a pit formed in the silicon platform, a chip positioned inside the pit, a first waveguide formed in the chip, and a second waveguide formed in the silicon platform. The pit may be defined at least in part by a sidewall and a base. The chip may include a first side and a first recess in the first side. The first side may be defined in part by a first cleaved or diced facet. The first recess may be defined in part by a first etched facet. The first waveguide may be configured to guide an optical beam to pass through the first etched facet. The second waveguide may be configured to guide the optical beam to pass through the sidewall. The second waveguide may be optically aligned with the first waveguide.

15 Claims, 9 Drawing Sheets

(56) References Cited

U.S. PATENT DOCUMENTS

| | | |
|---|---|---|
| 10,312,661 B2 | 6/2019 | Lambert |
| 10,545,291 B1* | 1/2020 | Anderson ............. H01S 5/5027 |
| 2005/0036739 A1 | 2/2005 | Doerr et al. |
| 2014/0219305 A1* | 8/2014 | Fang .................... H01S 5/1082 |
| | | 372/45.01 |
| 2014/0233596 A1* | 8/2014 | Fang .................... H01S 5/1082 |
| | | 372/45.012 |
| 2014/0239250 A1 | 8/2014 | Fang |
| 2015/0098676 A1 | 4/2015 | Krasulick |
| 2018/0011246 A1 | 1/2018 | Budd et al. |
| 2018/0081118 A1* | 3/2018 | Klamkin ................ H01S 5/187 |

\* cited by examiner

ETCHED FACET IN A MULTI QUANTUM WELL STRUCTURE

CROSS-REFERENCE TO RELATED APPLICATIONS

This application claims the benefit of U.S. Provisional Patent Application No. 62/770,532, filed Nov. 21, 2018, entitled "Etched Facet in a Multi Quantum Well Structure," which is incorporated by reference herein in its entirety.

BACKGROUND

As sizes of semiconductor devices continue to shrink, integration of various components on a substrate can be challenging. Processes which produce micron- or nano-scale feature sizes can be important for making next-generation semiconductor devices.

BRIEF SUMMARY

This application relates to integrating optical and electrical components and material on a silicon substrate. Embodiments may include a chip that is bonded to a silicon platform. The chip includes one or more etched facets to improve alignment between contact metal disposed or deposited on the chip, or an active region of the chip, or both, and/or patterns existing or to be printed on the silicon platform.

Embodiments may include multi quantum well structures. In some embodiments, an exemplary multi quantum well structure may include: a silicon platform having a pit formed in the silicon platform, a chip positioned inside the pit, a first waveguide formed in the chip, and a second waveguide formed in the silicon platform. The pit may be defined at least in part by a sidewall and a base. The chip may include a first side and a first recess in the first side. The first side may be defined in part by a first cleaved or diced facet. The first recess may be defined at least in part by a first etched facet. The first waveguide may be configured to guide an optical beam to pass through the first etched facet. The second waveguide may be configured to guide the optical beam to pass through the sidewall. The second waveguide may be optically aligned with the first waveguide.

In some embodiments, the chip may further include a second side and a second recess in the second side. The second side may be defined in part by a second cleaved or diced facet. The second cleaved facet may be opposite to the first cleaved facet. The second recess may be defined at least in part by a second etched facet. The first waveguide may be further configured to guide the optical beam to pass through the second etched facet. In some embodiments, the first etched facet and the second etched facet are spaced apart by a predetermined distance to optimize performance of a device (e.g., to increase efficiency of a laser or modulator).

In some embodiments, the chip may further include a third etched facet, a fourth etched facet, and a third waveguide extending from the third etched facet to the fourth etched facet. A distance between the first etched facet and the second etched facet may define a length of the first waveguide. A distance between the third etched facet and the second etched facet may define a length of the third waveguide. The chip may be configured to modulate light of a first optical channel propagating in the first waveguide. The chip may be configured to modulate light of a second optical channel propagating in the third waveguide. The length of the first waveguide may be longer than the length of the third waveguide based on light of the first optical channel having a longer wavelength than light of the second optical channel.

In some embodiments, the chip may further include a contact metal disposed or deposited on the chip. The contact metal may include a first end and a second end opposite to the first end. The first end of the contact metal may be substantially aligned with the first etched facet. The second end of the contact metal may be substantially aligned with the second etched facet. In some embodiments, the contact metal may be disposed or deposited directly on the chip.

In some embodiments, the first etched facet may be positioned at a predetermined distance from the sidewall. In some embodiments, the first etched facet may be oriented at a predetermined angle relative to the sidewall. In some embodiments, the first etched facet may be skewed with respect to at least one of the sidewall or the first cleaved or diced facet. In some embodiments, the chip may further include a connecting waveguide optically coupling the first waveguide with the second waveguide. In some embodiments, the first waveguide extends in a longitudinal direction that may be substantially perpendicular to the sidewall.

Embodiments may include chips. An exemplary chip may include a side defined in part by a cleaved or diced facet and a recess in the side. The recess may be defined in part by an etched facet. The etched facet may be positioned to intersect an optical path of light passing through the chip.

In some embodiments, the etched facet may be substantially parallel to the cleaved or diced facet. In some embodiments, the etched facet may be skewed relative to the cleaved or diced facet. In some embodiments, the chip may further include a contact metal disposed or deposited on the chip. The contact metal may include an end that may be substantially aligned with the etched facet.

In some embodiments, the side may be a first side, the cleaved or diced facet may be a first cleaved or diced facet, the recess may be a first recess, and the etched facet may be a first etched facet. The chip further may include a second side and a second recess in the second side. The second side may be defined in part by a second cleaved or diced facet opposite to the first cleaved or diced facet. The second recess may be defined in part by a second etched facet. The second etched facet may be positioned to intersect the optical path of light passing through the chip.

Embodiments may include methods for creating optical devices. In some embodiments, an exemplary method may include bonding a chip to a platform. The chip may include a cleaved or diced facet. The method may further include etching a facet in the cleaved or diced facet of the chip after bonding the chip to the platform. The method may also include applying a metal to the chip at a predetermined distance from the etched facet.

In some embodiments, the predetermined distance from the etched facet may be equal to or less than 8000 nm, equal to or less than 6000 nm, equal to or less than 4000 nm, equal to or less than 2000 nm, equal to or less than 1000 nm. In some embodiments, the method may further include forming a waveguide in the chip. The waveguide may be configured to guide light through the etched facet. In some embodiments, forming the waveguide in the chip may be performed after etching the facet. In some embodiments, the etched facet may be recessed relative to the cleaved or diced facet.

Figure 1:
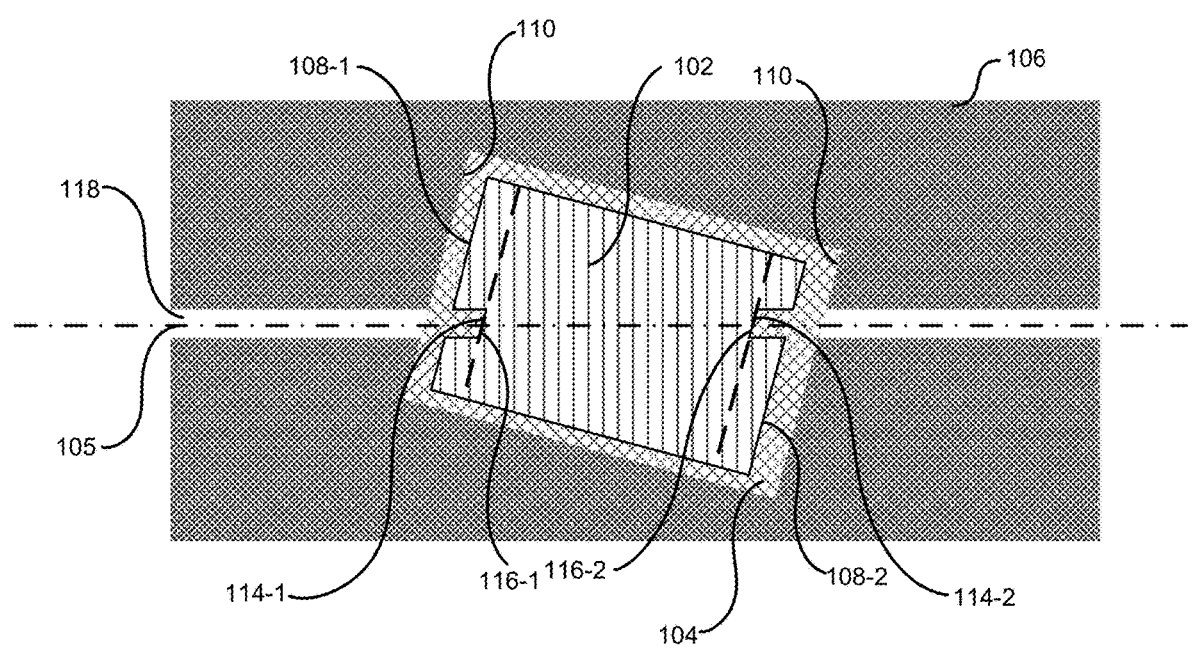
FIG. 1 illustrates an embodiment of a chip placed in a pit of a platform.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DESCRIPTION

Precise placement of contact metal (CM) on a chip in relation to facets of the chip can be challenging. The challenges come from a less precise placement of the chip inside a pit of a silicon platform after the chip has been manufactured but before the placement of the contact metal on the chip. Specifically, a wafer is diced or cleaved to create a plurality of chips. The chips thus have diced or cleaved facets. The chips are then placed in pits formed in a silicon platform, e.g., as described in U.S. patent application Ser. No. 14/509,914, filed on Oct. 8, 2014, which is incorporated by reference for all purposes. There can be variances as to where a chip is placed in a pit. Since chip placement is not precisely known, location of the cleaved or diced facet is not precisely known, and there is a limit to how close a contact metal can be placed to the cleaved or diced facet. The chip typically includes an active region, e.g., a III-V layer for a laser gain medium or for a modulator or a photodetector, inside the chip extending between the cleaved or diced facets. Consequently, there is a limit to the precise placement of the contact metal relative to the active region of the chip.

Efficiency of an optical device can be increased by placing contact metal closer to the facet of the chip. For example, in the gain medium of a laser, un-pumped chip material absorbs light very strongly. So the closer the contact metal material is to the facet, the more efficient the optical device, e.g., a laser or modulator, will be. In a modulator or a photodetector with a bonded chip as the active element, any length of the waveguide that extends beyond the contact metal will absorb light, increasing the insertion loss, without contributing to the functionality of the device. In addition, the efficiency and parametric performance of a semiconductor laser depends on the length of the gain medium so it is advantageous to be able to control this length without changing the length of the III-V semiconductor chip that provides the gain medium.

As the radio frequency bandwidth of modulators and photodetectors for high speed applications is higher when the length of the waveguide with the contact metal is shorter, it is advantageous to be able to control the length of the waveguide with the contact metal without changing the dimensions of the bonded chip.

In some embodiments, after the chips have been placed in the pits and bonded to the platform, the chips can be etched using, e.g., photolithography, to define one or more etched facets. Since the etched facets are formed after the chips have been bonded to the platform, the precise locations of the etched facets are known. In a subsequent operation, the contact metal can be placed much closer to the etched facets than to the cleaved or diced facets of the chips. Accordingly, photolithography or other suitable etching methods can be used to etch facets in a chip after bonding the chip to the platform, which allows closer placement of contact metal on the chip in relation to the etched facets. In addition, the length of the active waveguide can be adjusted by moving the location of the etched facet, allowing the active length of the device to be adjusted over a wide range and optimized without changing the dimensions of the bonded chip.

Embodiments described herein may also allow for the use of more cost-effective bonding methods by relaxing the requirement on the precise bonding positioning of the chip while achieving a sub-micron optical alignment between the active region of the chip and an optical bridge/waveguide as described in, for example, U.S. patent application Ser. No. 13/597,117, filed on Aug. 28, 2012, which is incorporated by reference for all purposes, and the '914 application.

Embodiments described herein may further eliminate Edge defects that may occur during handling of the chips. An edge imperfection that would degrade the quality of the cleaved or diced facet surface, e.g., chip scratch, void, residue, can be removed during the facet-etching process. This provides superior performance quality of the active material and enhances throughput yield. Various embodiments, along with many of their advantages and features, are described in more detail in conjunction with the below description and attached figures.

Cleaving chips may be challenging, expensive and may not scale well in a very high-volume manufacturing environment. Dicing chips can be a lot more cost effective and can scale to very high volumes. However, dicing creates facet defects which become light scattering center when placed in the optical path of a guided light beam. Etching a fresh facet in the chip material can eliminate the original diced facet along with all the light-scattering defects it contains.

FIG. 1 illustrates an embodiment of a chip 102 placed in a pit 104 of a platform 106. The platform 106 is a semiconductor material, e.g., formed from a silicon-on-insulator wafer. An optical path 105 is shown traversing the platform 106 and the chip 102. The chip 102 includes cleaved or diced facets 108. As illustrated, gaps between the cleaved or diced facets 108 of the chip 102 and sidewalls 110 of the pit 104 exist along sides of the chip 102, but the gaps vary in size since the exact location of the chip 102 inside the pit 104 is unknown. After bonding the chip 102 to the platform 106 inside the pit 104, an etching method, such as a wet or dry etch using photolithography, is employed to create two recesses 114 in the chip 102 along the optical path 105, thereby forming two etched facets 116 that intersect the optical path 105. In some embodiments, after bonding the chip 102 to the platform 106, a substrate of the bonded chip 102 is removed before the facets are etched. In some embodiments, both etched facets 116 may be formed in one etching process. In some embodiments, one etched facet 116 or a first etched facet 116-1 may be etched in one etching process, and another etched facet 116 or a second etched facet 116-2 may be etched in a subsequent process. The first etched facet 116-1 defines part of a first recess 114-1 in a first cleaved or diced facet 108-1. The second etched facet 116-2 defines part of a second recess 114-2 in a second cleaved or diced facet 108-2. The first etched facet 116-1 may be a facet forming the front side of a laser, and the second etched facet 116-2 may be a facet forming the back mirror of the laser, or vice versa. The etched facets 116 are formed at known locations with respect to a target, which is typically used to align masks during various etching or deposition processes using photolithography. Because a common wafer alignment target is used for etching the facets in the chip 102 and for subsequently applying the contact metal on the chip 102, close placement of the contact metal in relation to the etched facets 116 of the chip 102 can be achieved. Because the contact metal can be placed very close to the etched facets 116 (e.g., within 8000 nm or less), the amount of un-pumped III-V material during operation is reduced or substantially eliminated, and the efficiency of a laser or a modulator can be increased.

Figure 2:
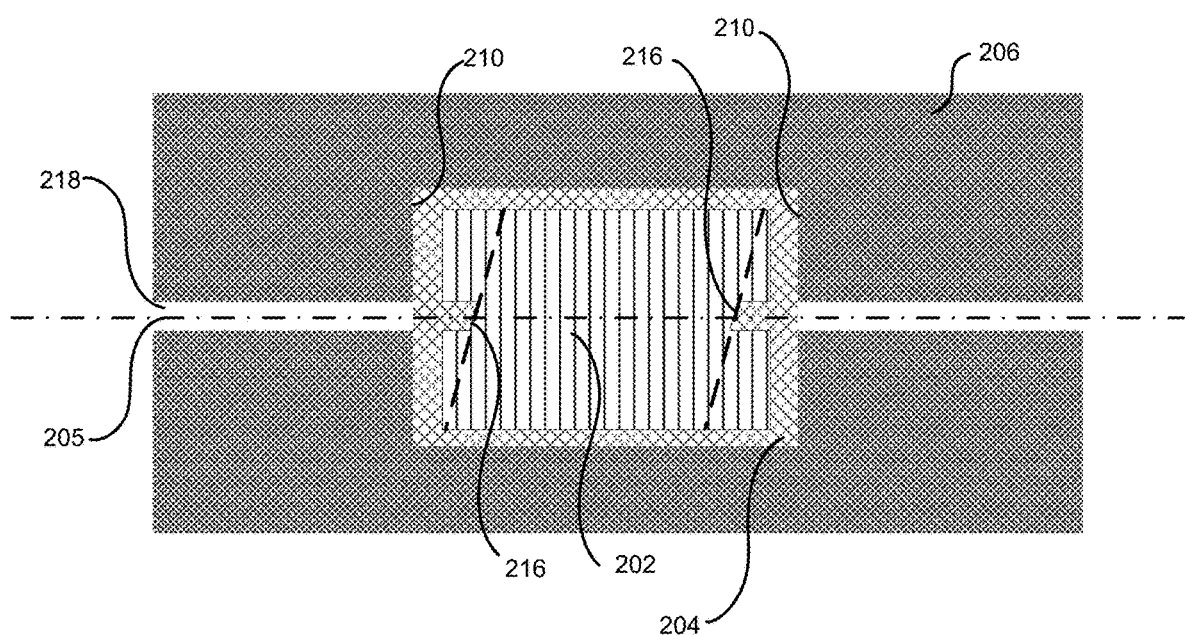
FIG. 2 illustrates another embodiment of a chip placed in a pit of a platform.

FIG. 2 illustrates an embodiment of a chip 202 bonded to a platform 206 where a rectangular pit 204 is aligned with the optical path 205. In the embodiment shown in FIG. 1, the pit 104, as well as the chip 102, is skewed relative to the optical path 105. The pit 104 and the chip 102 are skewed in relation to the optical path 105 to reduce reflection of light propagating along the optical path 105. In the various embodiments described herein, light passes through the etched facets instead of the cleaved or diced facets. The pit and the chip can thus be oriented at a suitable angle relative to the optical path based on other considerations, because the etched facets can be angled relative to the optical path to reduce light reflection. Accordingly, in some embodiments, such as in the embodiment shown in FIG. 1, the pit 104 may be skewed relative to the optical path 105, and the etched facets 116 may be parallel to the sidewall 110 of the pit 104. In some embodiments, such as in the embodiment shown in FIG. 2, the pit 204 may be placed to be aligned with the optical path 205, and the etched facets 216 are skewed relative to the sidewall 210 of the pit 204. Aligning the pit 204 with the optical path 205 can increase the overall chip density and/or other optical or electronic component density on the platform 206.

Although FIGS. 1 and 2 illustrate embodiments where recesses are formed along the two cleaved or diced facets traversing the optical path, these two cleaved or diced facets may be etched entirely across the chip so as to create etched facets (shown as dashed lines in FIGS. 1 and 2) that intersect with the other two cleaved or diced facets of the chip. Accordingly, the etched facets may include width dimensions that correspond to the width dimension of the optical path and/or the width dimension of the waveguides subsequently formed, such as waveguide 118 shown in FIG. 1 and waveguide 218 shown in FIG. 2. In some embodiments, the etched facets may include width dimensions that are substantially wider than the width dimension of the optical path and/or waveguides, and may even extend across the entire width dimension of the chip. In FIGS. 1 and 2, recesses are formed because the chip rests on pedestals, e.g., as described in the '914 application. The width dimensions of the etched facets may range from the width of the waveguide to the distance between the neighboring pedestals supporting the chip. In some embodiments, the etched facets are formed with width dimensions greater than the width dimension of the waveguides for ease of manufacturing and/or manufacturing tolerances. In some embodiments, the width dimensions of the etched facets are 5 µm, 6 µm, 7 µm, 8 µm, 9 µm, 10 µm, 11 µm, 12 µm, 13 µm, 14 µm, 15 µm, or greater. In some embodiments, the width dimensions of the etched facets are greater than 10 µm, and may range from 10 µm to from 10 µm to 30 µm, from 10 µm to 40 µm, from 10 µm to 50 µm, from 10 µm to 60 µm, from 10 µm to 70 µm, from 10 µm to 80 µm, from 10 µm to 90 µm, or from 10 µm to 100 µm.

Figure 3:
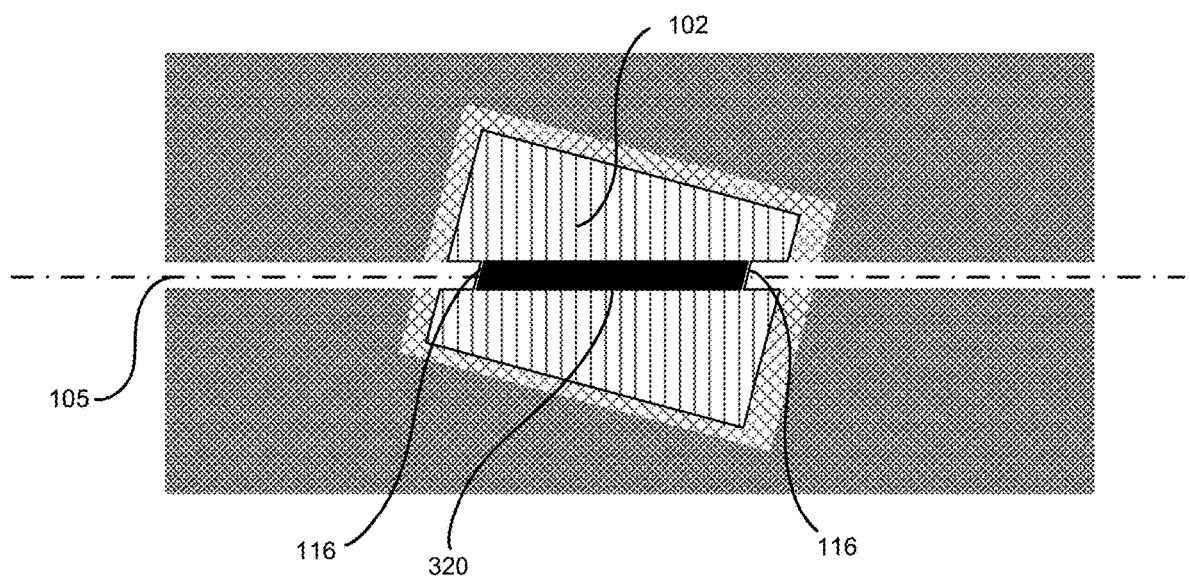
FIG. 3 illustrates the chip of FIG. 1 having etched facets and a contact metal formed on the chip between the etched facets.
Figure 4:
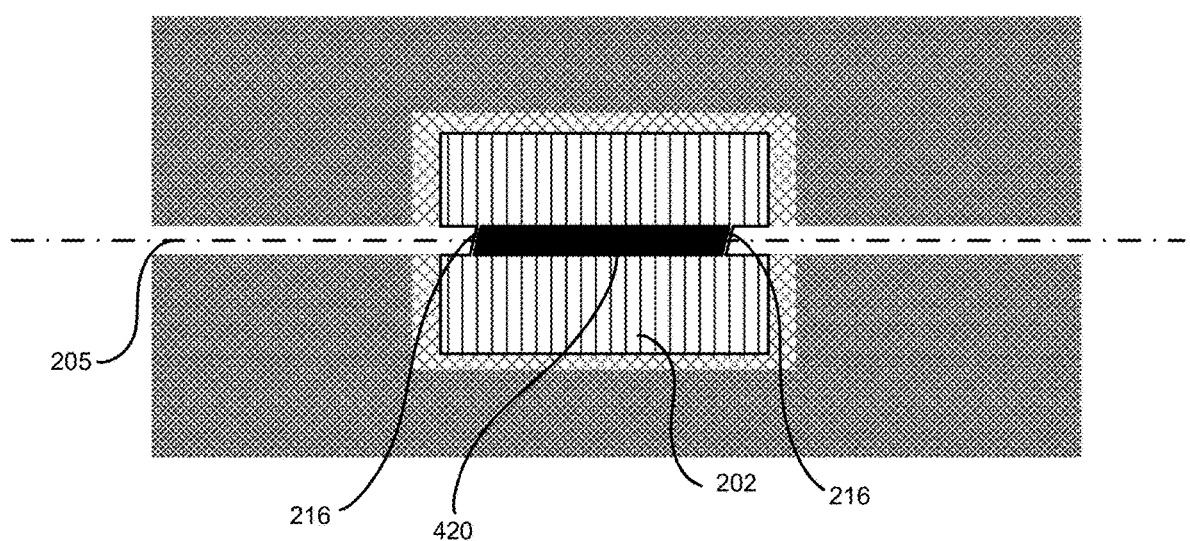
FIG. 4 illustrates the chip of FIG. 2 having etched facets and a contact metal formed on the chip between the etched facets.
Figure 5:
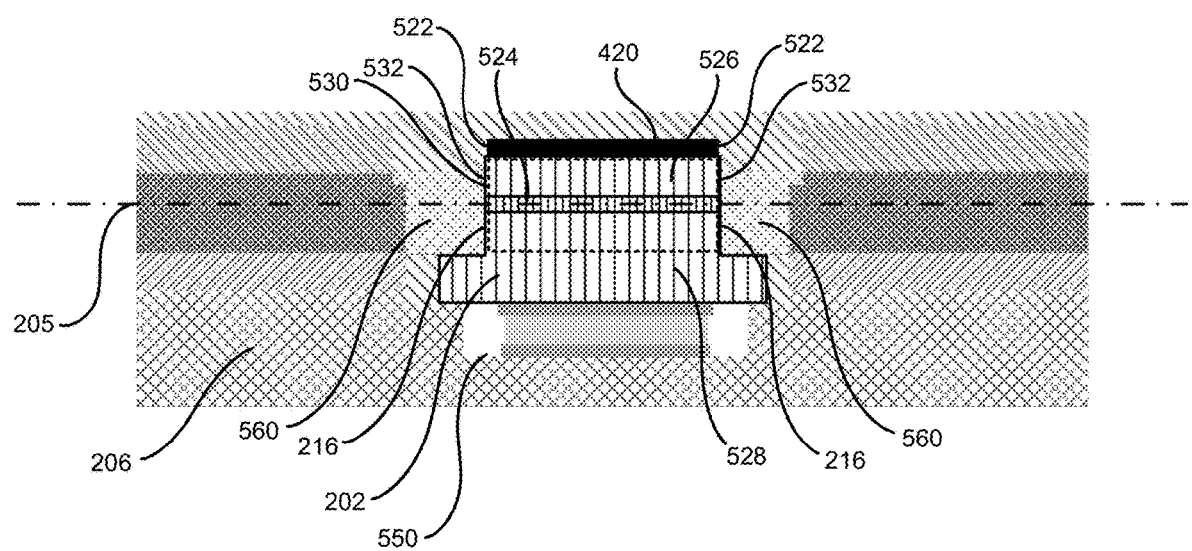
FIG. 5 illustrates a cross sectional view taken along an optical path of the chip of FIG. 4.
Figure 6:
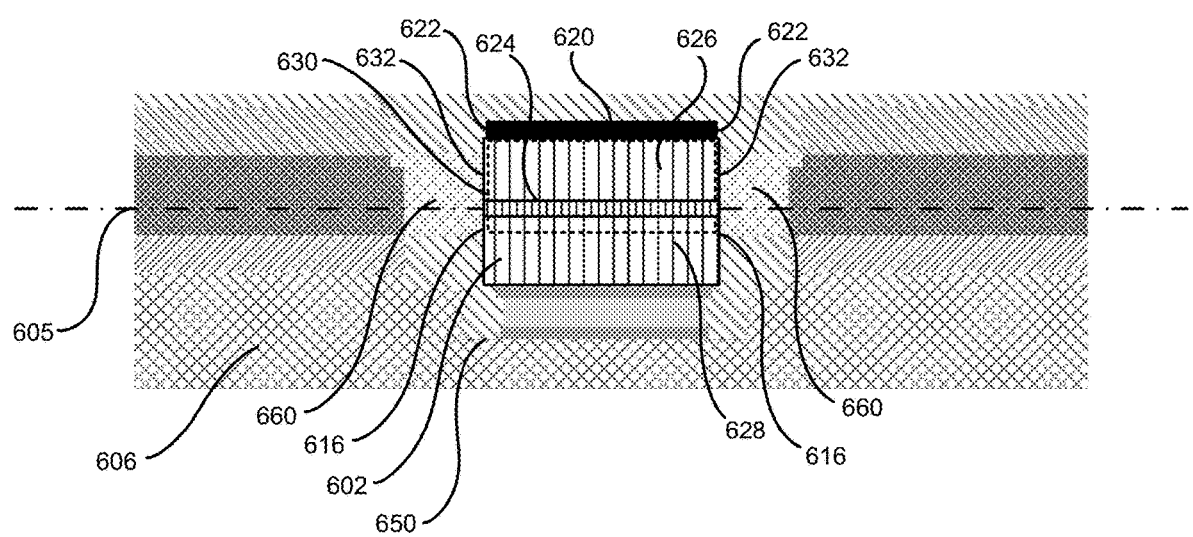
FIG. 6 is yet another embodiment of a chip placed in a pit of a platform.

FIG. 3 illustrates an embodiment of the chip 102 of FIG. 1 having the etched facets 116 and a contact metal 320 formed on the chip 102 between the etched facets 116. FIG. 4 illustrates an embodiment of the chip 202 of FIG. 2 having the etched facets 216 and a contact metal 420 formed on the chip 202 between the etched facets 216. FIG. 5 illustrates a cross sectional view taken along the optical path 205 of the chip 202 of FIG. 4. A cross sectional view taken along the optical path 105 of the chip 102 of FIG. 3 may be similar. Because the location of the etched facets 216 are known, close placement of the contact metal 420 on the chip 202 relative to the etched facets 216 is achieved. FIG. 5 shows that the ends 522 of the contact metal 420 are substantially aligned with the etched facets 216. Accordingly, the contact metal 420 overlays substantially the entire active region 524 along the optical path 205 across the chip 202. The amount of un-pumped III-V material along the optical path 205 is limited or substantially eliminated, which improves the device efficiency. It can also be seen that the length of the active region 524 is different from the dimension of the bonded chip 202 in that direction, i.e., along the optical path 205. The flexibility in where the photolithographically defined facets 216 can be etched on the bonded chip 202 allows the length of the active region 524 to be adjusted over a wide range independent of the dimensions of the bonded chip 202. When forming the etched facets 216, the chip 202 can be etched partially or all the way through because it is easier to stop the etch on the silicon handle of the SOI wafer platform 206. FIG. 6 is an embodiment of a chip 602 with etched facets 616 where the chip 602 is etched all the way through. In some embodiments, the chip may be etched only partially through, such as the embodiment shown in FIG. 5, as long as the etched facets intersect the active region of the chip.

By etching facets after the chip has been bonded to the platform, the length of a waveguide on the chip can be defined independently from the size of the chip. This offers several advantages. For example, short waveguides may be formed for modulators to reduce capacitance for high speed modulation. There are practical limits to how small the chips can be made and/or diced (e.g., chips are sometimes diced large enough for handling). By etching facets after bonding the chip to the platform, the modulation waveguide can be made much shorter than a length of the chip used for handling. Additionally, by etching the facets, lasers or modulators with different active-region or gain-medium lengths along the optical path can be fabricated for optimization without having to fabricate chips of different lengths.

With further reference to FIG. 5, the chip 202 may include a p-doped region 526 above the active region 524 and an n-doped region 528 below the active region 524. Similarly, the chip 602 in FIG. 6 may also include a p-doped region 626 above an active region 624 and an n-doped region 628 below the active region 624. The active regions 524, 624 each include a multi quantum well structure or a series of quantum wells. In some embodiments, the active region 524, 624 may include a structure other than multi quantum wells, for example, a layer of III-V material of homogenous composition. Current is injected into the respective chips 202, 602 through the respective p-doped regions 526, 626.

Because electrons in n-doped regions 528, 628 tend to drift more than holes in p-doped regions 526, 626, by injecting the current through the p-doped regions 526, 626, the current is more or less confined within the respective active regions 524, 624 along the optical path 205, 605. When current is injected through the p-doped regions 526, 626, ends of contact metal stripes (e.g., ends 522 of the contact metal 420 shown in FIG. 5 and ends 622 of the contact metal 620 shown in FIG. 6) and the ends of the waveguide formed in the chip (e.g., ends 532 of waveguide 530 shown in FIG. 5 and ends 632 of waveguide 630 shown in FIG. 6) may be as closely matched or aligned to reduce a distance between the end of the contact metal and the end of the waveguide of the chip (or between the end of the contact metal and the etched facet, since the etched facet can be used to define the end of the waveguide). The distance between the end of the contact metal and the end of the waveguide is reduced because holes may not spread significantly to cause a population inversion beyond the end of the contact metal. Portions of the active region without a population inversion can have high optical attenuation. Thus efficiency of the laser can be increased by having the end of the contact metal closer to the end of the waveguide of the chip. By etching the etched facet after the chip is bonded to the platform, the contact metal can be precisely placed with respect to the etched facet, wherein the etched facet is the end of the waveguide of the chip. In some embodiments, a chip may be configured with an n-doped region above the active region or gain medium and a p-doped region below the active region or gain medium for other considerations.

By forming etched facets after the chip has been placed in a pit of a platform (e.g., made of silicon) and bonded to the platform, close placement of contact metal and the etched facets can be achieved to reduce un-pumped regions in the chip, and performance of lasers and modulators is improved. It is also possible to adjust the length of the active region without changing the dimensions of the bonded chip. Further, because proper orientation of the etched facets relative to the optical path can be achieved after bonding the chip to the platform, which can be independent from the placement of the chip inside the pit, tolerances for placing and bonding the chip inside the pit can be relaxed. Relaxing the tolerance for chip placement can speed up the process for chip placement and/or make the manufacturing process more economical. Moreover, the technology described herein allows for the use of a chip size that is adequate for proper bond handling. To improve modulation speed and/or insertion loss, the chip size can be subsequently trimmed or reduced by reducing the dimensions of the active region using the facet-etching process and/or other integration processes, such as the bridge/waveguide integration process as described in the '117 application and the '914 application.

The technology described herein also allows for the capability of customizing or trimming the shape and form of the active region to provide various performance capabilities. For example, non-straight, including curved, waveguides may be implemented in the chip and reflective mirrors may be formed using the facet-etching process in planes that may not be parallel to crystal cleave planes or otherwise could not be obtained by the cleaving/dicing process used to produce the chips.

Figure 7:
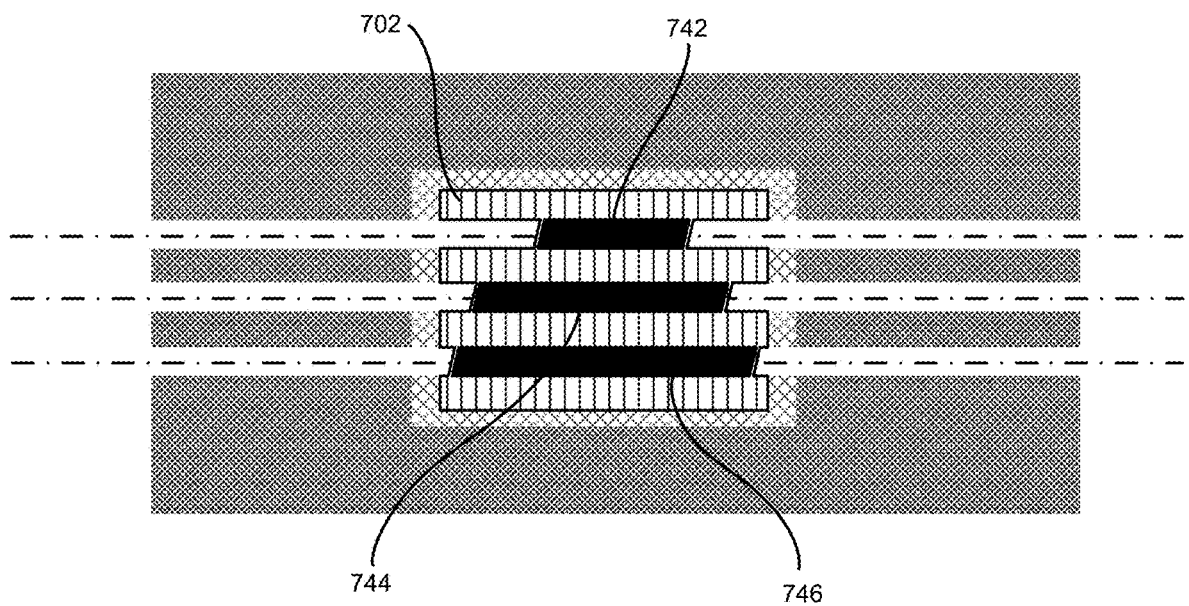
FIG. 7 is a further embodiment of a chip placed in a pit of a platform.

The capability of customizing or trimming the shape and form of the chip further allows for power balancing modulator chips using the same Epi or chip with optical channels having different wavelengths. For example, for optical channels having relatively long wavelengths, facets may be etched to form longer modulators to absorb more with a given bandgap. For optical channels having relatively short wavelength, facets may be etched in the same chip to form shorter modulators as the same given bandgap is more efficient at absorbing. This capability further allows for scaling a number of waveguides on the same Epi or in the chip for different optical channels. One exemplary modulator chip 702 is shown in FIG. 7. The modulator chip 702 is formed with multiple waveguides in the chip 742, 744, 746 that have different forms, e.g., different lengths, configured or optimized for the different optical channels having different wavelengths. The different lengths of the waveguides in the chip 742, 744, 746 may be selected or determined for optimized electro-absorption at the respective wavelengths and/or to achieve a desired balance of extinction ratio and average loss.

Locations of etched facets, such as distances between etched facets, can be adjusted to customize or shape the chip based on various other considerations. For example, for a laser incorporating the chip having etched facets, locations of the etched facets may be set to adjust the length of the waveguide in the chip to optimize performance of the laser. A longer length between facets provides a longer gain section, which can increase output power of a laser. If less power is sufficient for a given application, a shorter length between facets can be used to reduce a threshold of the laser to reduce power consumption of the laser. Thus one size of chip (and/or pit in the platform) can be used for many different applications by customizing etched facet locations for a specific application. In some embodiments, different lengths of waveguides are made in a single chip. Thus one chip can be used as a gain medium for two or more lasers of differing powers (e.g., one chip can be used as a gain medium for both for a higher-power laser and lower-power, more efficient, laser). In some embodiments, an etched facet can be used as a mirror (e.g., either open to air or a reflective coating, such as a metal, is applied to the etched facet). For example, one etched facet is used as a first mirror for a laser resonator and a second mirror, formed in the platform, is used as a second mirror for the laser resonator. The etched facet, used as the first mirror, can be placed at a selected location in the chip to control a length of a gain section of the laser (e.g., the first mirror is not limited to a location of a cleaved facet of the chip).

Figure 8:
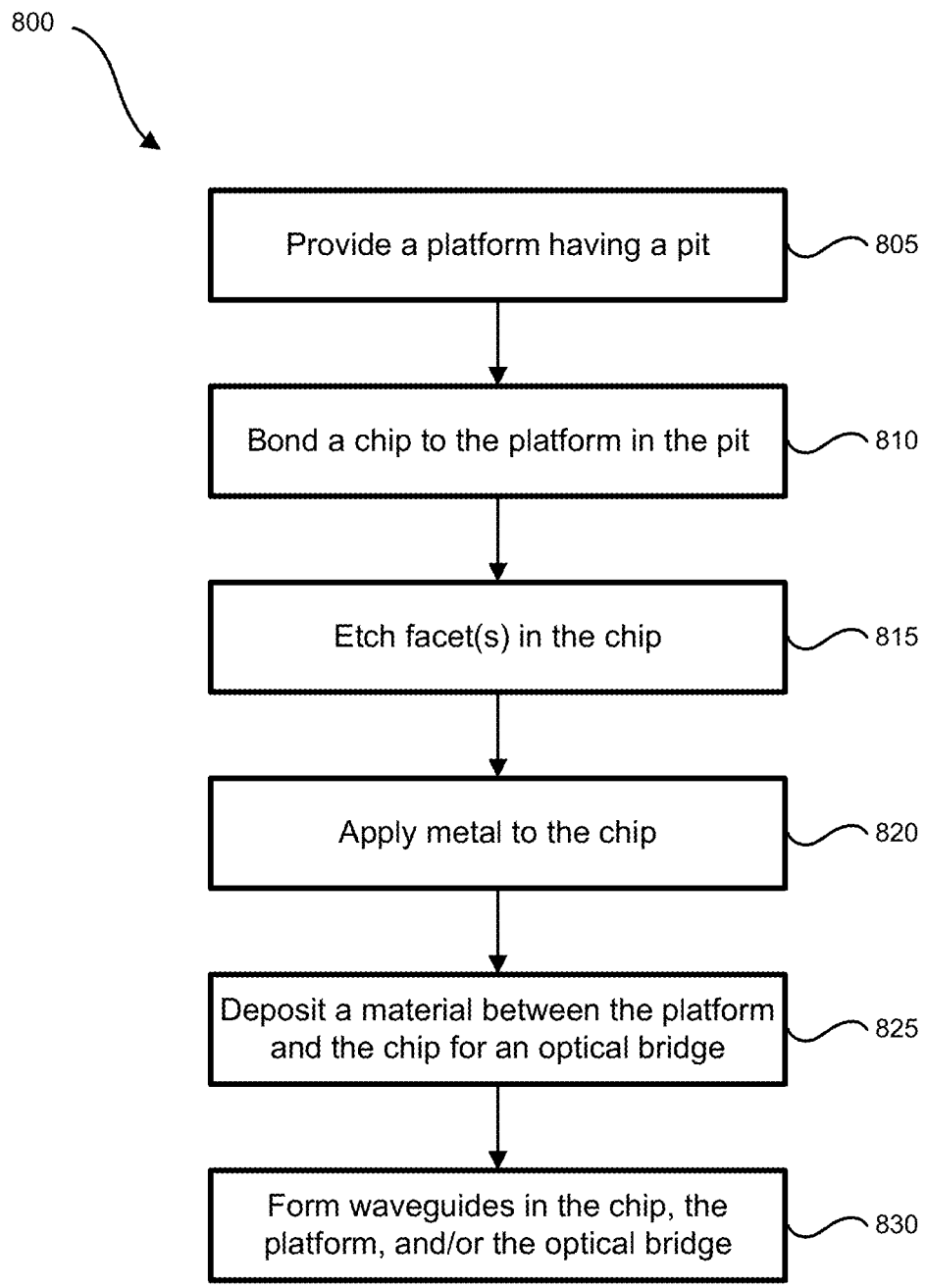
FIG. 8 illustrates an embodiment of a process for creating an optical device.

FIG. 8 illustrates an embodiment of a process 800 for creating an optical device. Process 800 will be described with reference to one or more of the devices shown and described above. However, it is noted that the process described herein may be also utilized to create other similar or different devices as would be appreciated by one skilled in the art.

The process 800 begins at operation 805 by providing a platform with a pit formed in the platform, e.g., platform 106, 206 with pit 104, 204 as described above. At operation 810, a chip, e.g., chip 102, 202, is then placed in the pit and bonded to the platform inside the pit. The chip may be soldered to a base or floor of the pit, e.g., base 550 shown in FIG. 5 and/or base 650 shown in FIG. 6. As also shown in FIGS. 5 and 6, gaps may exist between the sidewalls of the pit and cleaved or diced facets of the chip. At operation 815, the chip is then etched to create one or more etched facets, e.g., etched facets 116, 216, 616, on the sides of the chip. Photolithography or other etching methods may be used in creating the etched facets. In some embodiments, after bonding the chip to the platform and prior to forming the etched facets, a substrate of the chip may be removed.

At operation 820, metal is then applied to the chip to form a metal contact, e.g., contact metal 320, 420, 620, for the chip. The placement of the contact metal is based on locations of the etched facet. In some embodiments, the ends of the contact metal are substantially aligned with the etched facets, such as shown in FIGS. 5 and 6. In some embodiments, the ends of the contact metal may be placed from the etched facet at predetermined distances. Depending on the application, the predetermined distances may be equal to or less than 8000 nm, equal to or less than 7500 nm, equal to or less than 7000 nm, equal to or less than 6500 nm, equal to or less than 6000 nm, equal to or less than 5500 nm, equal to or less than 5000 nm, equal to or less than 4500 nm, equal to or less than 4000 nm, equal to or less than 3500 nm, equal to or less than 3000 nm, equal to or less than 2500 nm, equal to or less than 2000 nm, equal to or less than 1500 nm, equal to or less than 1000 nm, equal to or less than 800 nm, equal to or less than 600 nm, equal to or less than 400 nm, equal to or less than 200 nm, equal to or less than 100 nm, equal to or less than 50 nm, equal to or less than 10 nm, or less. In some embodiments, a distance from an end of the contact metal to an etched facet is equal to or greater than 0.5, 1, 5, 10, 20, or 50 nm. At operation 825, a material, such as amorphous silicon, is then deposited for forming an optical bridge between the platform and the chip, such as optical bridge 560 shown in FIG. 5 and/or optical bridge 660 shown in FIG. 6. At operation 830, a waveguide, e.g., waveguide 530 shown in FIG. 5 and/or waveguide 630 shown in FIG. 6, is then formed in the chip to guide light through the etched facets. Waveguides can also be formed in the optical bridge and/or the platform concurrently with forming the waveguide in the chip.

Although the process 800 illustrated in FIG. 8 includes only one operation for forming one or more etched facets, multiple facet-etching operations may be implemented. For example, two etched facets may be formed on opposite sides of the chip in one etching operation in some embodiments. In some embodiments, one facet or the first facet may be etched in one etching operation, and the second facet may be etched in a subsequent etching operation. There may be one or more operations performed between the two etching operations for forming the respective etched facets. Further, through the operation for forming the one or more etched facets, one or more waveguides in the chip may be formed. For example, in some embodiments, two, or a pair of, etched facets may be formed at the opposite ends of one waveguide in the chip, such as shown in FIGS. 1-6. In some embodiments, one or more additional pairs of etched facets may be formed at opposite ends of one or more additional waveguides in the chip, such as shown in FIG. 7.

Figure 9:
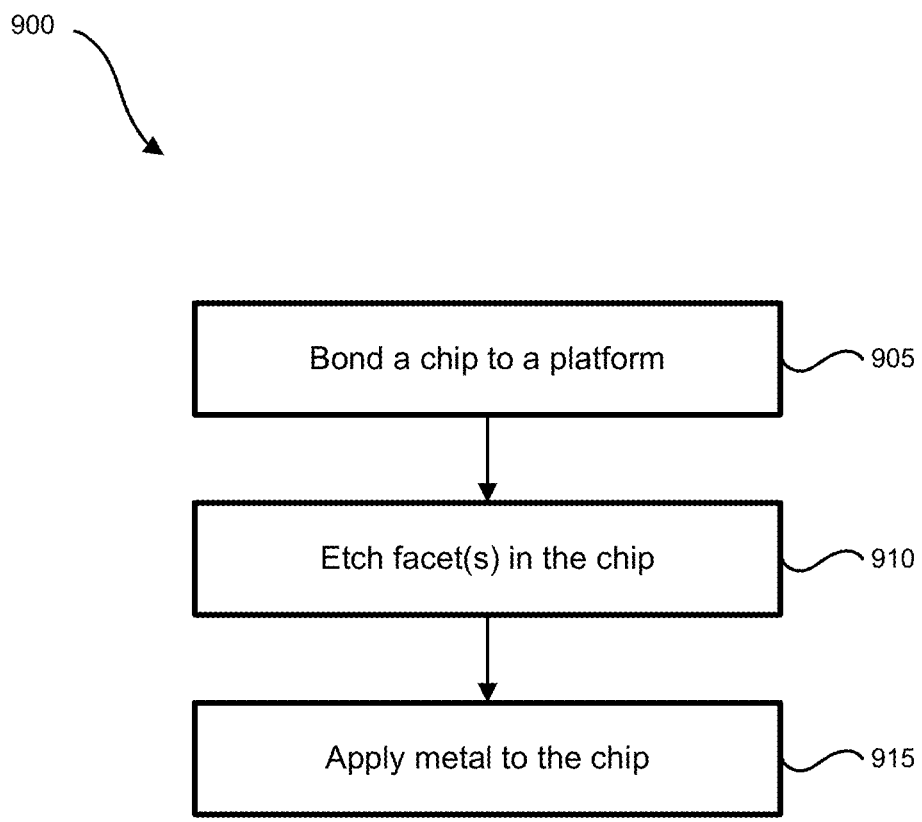
FIG. 9 illustrates another embodiment of a process for creating an optical device.

FIG. 9 illustrates another embodiment of a process 900 for creating an optical device. Process 900 will be described with reference to one or more of the devices shown and described above. However, it is noted that the process described herein may be also utilized to create other similar or different devices as would be appreciated by one skilled in the art. The process 900 begins at operation 905 by bonding a chip, e.g., chip 102, 202, 602, 702, to a platform, e.g., platform 106, 206, 606. After bonding the chip to the platform, at operation 910, one or more facets, e.g., etched facets 116, 216, 616, are etched in the chip. At operation 915, a metal contact, e.g., metal contact 320, 420, 620, is then applied to the chip at a predetermined distance from the one or more etched facets.

The specific details of particular embodiments may be combined in any suitable manner without departing from the spirit and scope of embodiments of the invention. However, other embodiments of the invention may be directed to specific embodiments relating to each individual aspect, or specific combinations of these individual aspects.

The above description of exemplary embodiments of the invention has been presented for the purposes of illustration and description. It is not intended to be exhaustive or to limit the invention to the precise form described, and many modifications and variations are possible in light of the teaching above. The embodiments were chosen and described in order to explain the principles of the invention and its practical applications to thereby enable others skilled in the art to utilize the invention in various embodiments and with various modifications as are suited to the particular use contemplated.

What is claimed is:

1. A device comprising:
   a silicon platform having a pit formed in the silicon platform, the pit being defined at least in part by a sidewall and a base;
   a chip positioned inside the pit, the chip comprising:
      a side defined in part by a cleaved or diced facet;
      a recess in the side, wherein the recess is defined at least in part by an etched facet; and
      a first waveguide formed in the chip, wherein:
         the first waveguide is configured to guide an optical beam along an optical path to pass through the etched facet; and
         the etched facet is skew with respect to the optical path;
   a second waveguide formed in the silicon platform, wherein:
      the second waveguide is configured to guide the optical beam to pass through the sidewall, and
      the second waveguide is optically aligned with the first waveguide; and
   a connecting waveguide, extending from the etched facet of the chip to the sidewall of the silicon platform, configured to directly couple the first waveguide with the second waveguide.

2. The device as recited in claim 1, wherein:
   the side is a first side;
   the cleaved or diced facet is a first cleaved or diced facet;
   the recess is a first recess;
   the etched facet is a first etched facet;
   the chip further comprises:
      a second side defined in part by a second cleaved or diced facet; and
      a second recess in the second side;
   the second cleaved or diced facet is opposite to the first cleaved or diced facet;
   the second recess is defined at least in part by a second etched facet; and
   the first waveguide is configured to guide the optical beam to pass through the second etched facet.

3. The device as recited in claim 2, wherein the first etched facet and the second etched facet are spaced apart by a predetermined distance configured to optimize electro-absorption at a predetermined wavelength.

4. The device as recited in claim 3, further comprising a third etched facet, a fourth etched facet, and a third waveguide extending from the third etched facet to the fourth etched facet, wherein:
   a distance between the first etched facet and the second etched facet defines a length of the first waveguide;
   a distance between the third etched facet and the second etched facet defines a length of the third waveguide;
   the chip is configured to modulate light of a first optical channel propagating in the first waveguide;

the chip is configured to modulate light of a second optical channel propagating in the third waveguide; and the length of the first waveguide is longer than the length of the third waveguide based on light of the first optical channel having a longer wavelength than light of the second optical channel.

5. The device as recited in claim 2, further comprising a contact metal disposed on the chip, the contact metal having a first end and a second end opposite to the first end, wherein:

the first end of the contact metal is substantially aligned with the first etched facet; and the second end of the contact metal is substantially aligned with the second etched facet.

6. The device as recited in claim 5, wherein the contact metal is disposed directly on the chip.

7. The device of claim 5, wherein the first end of the contact metal is disposed on the chip at a predetermined distance from the first etched facet, and the predetermined distance from the first end to the etched facet is equal to or less than 8000 nm.

8. The device as recited in claim 1, wherein the etched facet is positioned at a predetermined distance from the sidewall.

9. The device as recited in claim 1, wherein the etched facet is oriented at a predetermined angle relative to the sidewall.

10. The device as recited in claim 1, wherein the etched facet is skew with respect to at least one of the sidewall or the cleaved or diced facet.

11. The device as recited in claim 1, wherein the first waveguide extends in a longitudinal direction that is substantially perpendicular to the sidewall.

12. The device as recited in claim 1, wherein the etched facet is substantially parallel to the cleaved or diced facet.

13. A method comprising:

bonding a chip within a pit of a silicon platform, wherein:
the pit is defined at least in part by a sidewall and a base; and
the chip comprises a side defined in part by a cleaved or diced facet;

etching a facet in the cleaved or diced facet of the chip to form an etched facet, defining a part of a recess in the side of the chip, after bonding the chip to the silicon platform;

etching the chip to form a first waveguide in the chip, after bonding the chip to the silicon platform, wherein:
the first waveguide is configured to guide an optical beam along an optical path to pass through the etched facet; and
the etched facet is skew with respect to the optical path;

etching the silicon platform to form a second waveguide in the silicon platform, after bonding the chip to the silicon platform, wherein the second waveguide is configured to guide the optical beam to pass through the sidewall; and forming a connecting waveguide extending from the etched facet of the chip to the sidewall of the silicon platform, configured to directly couple the first waveguide with the second waveguide.

14. The method of claim 13, wherein forming the first waveguide in the chip is performed after forming the etched facet.

15. The method of claim 13, further comprising applying a metal to the chip at a predetermined distance from the etched facet.

* * * * *